(12) United States Patent
Wadekar et al.

(10) Patent No.: US 12,712,504 B1
(45) Date of Patent: Aug. 18, 2026

(54) CONSTANT TRANSCONDUCTANCE-RESISTANCE TRACKING CIRCUIT FOR COMPLEMENTARY METAL OXIDE SEMICONDUCTOR AMPLIFIERS

(71) Applicant: Synopsys, Inc., Sunnyvale, CA (US)

(72) Inventors: Jayesh Wadekar, Pune (IN); Atul Kabra, Pune (IN); Jairaj Naik K R, Bangalore (IN)

(73) Assignee: Synopsys, Inc., Sunnyvale, CA (US)

( * ) Notice: Subject to any disclaimer, the term of this patent is extended or adjusted under 35 U.S.C. 154(b) by 683 days.

(21) Appl. No.: 17/866,274

(22) Filed: Jul. 15, 2022

(51) Int. Cl.
*H03F 3/04* (2006.01)
*H03F 1/30* (2006.01)
*H03F 3/45* (2006.01)

(52) U.S. Cl.
CPC ......... *H03F 3/45183* (2013.01); *H03F 1/301* (2013.01); *H03F 3/45273* (2013.01); *H03F 1/302* (2013.01); *H03F 2200/84* (2013.01); *H03F 2203/45288* (2013.01)

(58) Field of Classification Search
CPC .. H03F 3/45183; H03F 1/301; H03F 3/45273; H03F 2200/84; H03F 2203/45288; H03F 3/343; H03F 3/345; H03F 3/45071; H03F 3/45085; G05F 3/265
USPC ......................... 330/257, 288, 261–264, 267
See application file for complete search history.

(56) References Cited

U.S. PATENT DOCUMENTS 5,285,168 A * 2/1994 Tomatsu ............. H03F 3/45192 330/253
5,512,855 A * 4/1996 Kimura .................... G01K 7/01 374/E7.035
5,926,062 A * 7/1999 Kuroda .................. G05F 3/265 327/513
6,600,303 B2 * 7/2003 Ikehashi ................. H03F 3/345 323/315
6,686,772 B2 * 2/2004 Li ....................... H03F 3/45237 326/115

(Continued)

OTHER PUBLICATIONS

Razavi, Behzad, Design of Analog CMOS Integrated Circuits, Second Edition, Chapter 12, Bandgap References, Published by McGraw-Hill Education, New York, NY, 2017, pp. 524-525 and cover page.

*Primary Examiner* — Khanh V Nguyen
(74) *Attorney, Agent, or Firm* — WOMBLE BOND DICKINSON (US) LLP

(57) ABSTRACT

A constant transconductance-resistance ($g_mR$) tracking biasing circuit includes: a first p-type metal oxide semiconductor (pMOS) transistor and a second pMOS transistor connected to form a first current mirror; and a first n-type metal oxide semiconductor (nMOS) transistor and a second nMOS transistor connected to form a second current mirror, the constant $g_mR$ tracking biasing circuit being configured to generate a bias output signal in accordance with currents flowing through the first pMOS transistor, the second pMOS transistor, the first nMOS transistor, and the second nMOS transistor, and the bias output signal being configured to control a pMOS transconductance of an input pMOS transistor and an nMOS transconductance of an input nMOS transistor of an analog circuit.

20 Claims, 9 Drawing Sheets

(56) References Cited

U.S. PATENT DOCUMENTS

| | | | | |
|---|---|---|---|---|
| 6,844,773 | B2 * | 1/2005 | Ishida | H03F 3/4521<br>327/543 |
| 7,265,625 | B2 * | 9/2007 | Klemmer | H03F 3/45183<br>330/261 |
| 8,289,257 | B1 * | 10/2012 | Simon | G09G 3/3611<br>330/69 |
| 9,891,644 | B1 * | 2/2018 | Ming | G05F 1/575 |
| 10,374,554 | B2 * | 8/2019 | Karmaker | H03F 3/45497 |

* cited by examiner

CONSTANT TRANSCONDUCTANCE-RESISTANCE TRACKING CIRCUIT FOR COMPLEMENTARY METAL OXIDE SEMICONDUCTOR AMPLIFIERS

TECHNICAL FIELD

The present disclosure relates to analog electronics, in particular analog amplifiers.

BACKGROUND

The gain of an analog amplifier circuit depends on the transconductance (gm) of its transistor or transistors. However, the gm of the transistor can vary greatly over various process corners during manufacturing (e.g., variations in parameters of the transistor due to the location of the integrated circuit that includes the transistor on a semiconductor wafer) as well as environmental conditions such as supply voltage and temperature (process, voltage, and temperature or PVT variation). Therefore, a tracking circuit may be used to control the bias current supplied to the analog amplifier circuit to control the gain (or overall transconductance) of the amplifier circuit in order to reduce the effect of PVT variation.

SUMMARY

According to one example of the present disclosure, a constant transconductance-resistance ($g_mR$) tracking biasing circuit includes: a first p-type metal oxide semiconductor (pMOS) transistor and a second pMOS transistor connected to form a first current mirror; and a first n-type metal oxide semiconductor (nMOS) transistor and a second nMOS transistor connected to form a second current mirror, the constant $g_mR$ tracking biasing circuit being configured to generate a bias output signal in accordance with currents flowing through the first pMOS transistor, the second pMOS transistor, the first nMOS transistor, and the second nMOS transistor, and the bias output signal being configured to control a pMOS transconductance of an input pMOS transistor and an nMOS transconductance of an input nMOS transistor of an analog circuit.

The constant $g_mR$ tracking biasing circuit may include: a pMOS tracking circuit portion including the first pMOS transistor and the second pMOS transistor; and an nMOS tracking circuit portion including the first nMOS transistor and the second nMOS transistor, wherein the bias output signal includes: an output pMOS bias voltage set by the pMOS tracking circuit portion based on a first current flowing through the first pMOS transistor and a second current flowing through the second pMOS transistor; and an output nMOS bias voltage set by the nMOS tracking circuit portion based on on a third current flowing through the first nMOS transistor and a fourth current flowing through the second nMOS transistor, wherein the output pMOS bias voltage is configured to set a pMOS bias current and the output nMOS bias voltage is configured to set an nMOS bias current, and wherein the pMOS transconductance of the input pMOS transistor and the nMOS transconductance of the nMOS input transistor are set based on a sum of the pMOS bias current and the nMOS bias current.

The pMOS tracking circuit portion may further include: a first amplifier circuit portion configured to control the first current flowing through the first pMOS transistor to be equal to the second current flowing through the second pMOS transistor, and the nMOS tracking circuit portion may further include: a second amplifier circuit portion configured to control the third current flowing through the first nMOS transistor to be equal to the fourth current flowing through the second nMOS transistor.

The pMOS tracking circuit portion may further include: a third nMOS transistor connected to a drain electrode of the first pMOS transistor; and a fourth nMOS transistor connected to a drain electrode of the second pMOS transistor, the first amplifier circuit portion may include a fifth nMOS transistor, the fifth nMOS transistor being diode-connected, the third nMOS transistor, the fourth nMOS transistor, and the fifth nMOS transistor may have gate electrodes that are electrically connected together, the output pMOS bias voltage may be set based on a voltage at the gate electrodes of the third nMOS transistor, the fourth nMOS transistor, and the fifth nMOS transistor, the nMOS tracking circuit portion may further include: a third pMOS transistor connected to a drain electrode of the first nMOS transistor; and a fourth pMOS transistor connected to a drain electrode of the second nMOS transistor, the second amplifier circuit portion may include a fifth pMOS transistor, the fifth pMOS transistor being diode-connected, the third pMOS transistor, the fourth pMOS transistor, and the fifth pMOS transistor may have gate electrodes that are electrically connected together, and the output pMOS bias voltage may be set based on a voltage at the gate electrodes of the third pMOS transistor, the fourth pMOS transistor, and the fifth pMOS transistor.

The bias output signal may include an output bias voltage set based on: a first current flowing through the first pMOS transistor and the first nMOS transistor; and a second current flowing through the second pMOS transistor and the second nMOS transistor.

The constant $g_mR$ tracking biasing circuit may further include an amplifier portion configured to control the first current flowing through the first pMOS transistor and the first nMOS transistor to be equal to the second current flowing through the second pMOS transistor and the second nMOS transistor.

The amplifier portion may include: a third nMOS transistor having a gate electrode connected to gate electrodes of the first nMOS transistor and the second nMOS transistor; a fourth pMOS transistor having a source electrode connected to a source electrode of the third nMOS transistor and a gate electrode connected to a source electrode of the first pMOS transistor; and a fifth nMOS transistor having a drain electrode connected to a source electrode of the fourth pMOS transistor, and the constant $g_mR$ tracking biasing circuit may further include: a sixth nMOS transistor having a drain electrode connected to a source electrode of the first pMOS transistor; and a seventh nMOS transistor having a drain electrode connected to a source electrode of the second pMOS transistor and having a gate electrode connected to gate electrodes of the fifth nMOS transistor and the sixth nMOS transistor.

The output bias voltage may be measured from: the gate electrodes of the first nMOS transistor, the second nMOS transistor, and the third nMOS transistor, or the gate electrodes of the fifth nMOS transistor, the sixth nMOS transistor, and the seventh nMOS transistor.

The bias output signal may be configured to control an effective transconductance based on a sum of the pMOS transconductance of the input pMOS transistor and the nMOS transconductance of the nMOS input transistor to within ±1.5% of a nominal effective transconductance value over a temperature range of −40° C. to 125° C.

According to one example of the present disclosure, an electrical circuit includes: a complementary metal oxide semiconductor (cMOS) analog circuit including an input p-type metal oxide semiconductor (pMOS) transistor; an input n-type metal oxide semiconductor (nMOS) transistor; and a degeneration resistance; and a constant transconductance-resistance ($g_mR$) tracking biasing circuit including: a first p-type metal oxide semiconductor (pMOS) transistor and a second pMOS transistor connected to form a first current mirror; and a first n-type metal oxide semiconductor (nMOS) transistor and a second nMOS transistor connected to form a second current mirror, the constant $g_mR$ tracking biasing circuit being configured to generate a bias output signal in accordance with currents flowing through the first pMOS transistor, the second pMOS transistor, the first nMOS transistor, and the second nMOS transistor, and the bias output signal being configured to control a pMOS transconductance of the input pMOS transistor and an nMOS transconductance of the input nMOS transistor such that a product of the degeneration resistance with an effective transconductance based on a sum of the pMOS transconductance and the nMOS transconductance is substantially constant.

The electrical circuit may further include: a differential pair of pMOS transistors including the input pMOS transistor and a second input pMOS transistor; and a differential pair of nMOS transistors including the input nMOS transistor and a second input nMOS transistor.

The constant $g_mR$ tracking biasing circuit may include: a pMOS tracking circuit portion including the first pMOS transistor and the second pMOS transistor configured to generate an output pMOS bias voltage; and an nMOS tracking circuit portion including the first nMOS transistor and the second nMOS transistor configured to generate an output nMOS bias voltage, wherein the output pMOS bias voltage may be configured to set a pMOS bias current and the output nMOS bias voltage may be configured to set an nMOS bias current, and wherein the bias output signal may be set based on a sum of the pMOS bias current and the nMOS bias current.

The bias output signal may include an output bias voltage set based on: a first current flowing through the first pMOS transistor and the first nMOS transistor; and a second current flowing through the second pMOS transistor and the second nMOS transistor.

The constant $g_mR$ tracking biasing circuit may include an amplifier portion configured to control the first current flowing through the first pMOS transistor and the first nMOS transistor to be equal to the second current flowing through the second pMOS transistor and the second nMOS transistor.

According to one example of the present disclosure, a non-transitory computer-readable medium including a stored description of a constant transconductance-resistance ($g_mR$) tracking biasing circuit, the constant $g_mR$ tracking biasing circuit including: a first p-type metal oxide semiconductor (pMOS) transistor and a second pMOS transistor connected to form a first current mirror; and a first n-type metal oxide semiconductor (nMOS) transistor and a second nMOS transistor connected to form a second current mirror, the constant $g_mR$ tracking biasing circuit being configured to generate a bias output signal in accordance with currents flowing through the first pMOS transistor, the second pMOS transistor, the first nMOS transistor, and the second nMOS transistor, and the bias output signal being configured to control a pMOS transconductance of an input pMOS transistor and an nMOS transconductance of an input nMOS transistor of an analog circuit.

The stored description of the constant $g_mR$ tracking biasing circuit may include descriptions of: a pMOS tracking circuit portion including the first pMOS transistor and the second pMOS transistor; and an nMOS tracking circuit portion including the first nMOS transistor and the second nMOS transistor, wherein the bias output signal includes: an output pMOS bias voltage set by the pMOS tracking circuit portion based on a first current flowing through the first pMOS transistor and a second current flowing through the second pMOS transistor; and an output nMOS bias voltage set by the nMOS tracking circuit portion based on on a third current flowing through the first nMOS transistor and a fourth current flowing through the second nMOS transistor, wherein the output pMOS bias voltage is configured to set a pMOS bias current and the output nMOS bias voltage is configured to set an nMOS bias current, and wherein the pMOS transconductance of the input pMOS transistor and the nMOS transconductance of the nMOS input transistor are set based on a sum of the pMOS bias current and the nMOS bias current.

The description of the pMOS tracking circuit portion may further include a description of: a first amplifier circuit portion configured to control the first current flowing through the first pMOS transistor to be equal to the second current flowing through the second pMOS transistor, and the description of the nMOS tracking circuit portion may further include a description of: a second amplifier circuit portion configured to control the third current flowing through the first nMOS transistor to be equal to the fourth current flowing through the second nMOS transistor.

The bias output signal may include an output bias voltage set based on: a first current flowing through the first pMOS transistor and the first nMOS transistor; and a second current flowing through the second pMOS transistor and the second nMOS transistor.

The description of the constant $g_mR$ biasing tracking circuit may further include a description of an amplifier portion configured to control the first current flowing through the first pMOS transistor and the first nMOS transistor to be equal to the second current flowing through the second pMOS transistor and the second nMOS transistor.

The description of the amplifier portion may further include descriptions of: a third nMOS transistor having a gate electrode connected to gate electrodes of the first nMOS transistor and the second nMOS transistor; a fourth pMOS transistor having a source electrode connected to a source electrode of the third nMOS transistor and a gate electrode connected to a source electrode of the first pMOS transistor; and a fifth nMOS transistor having a drain electrode connected to a source electrode of the fourth pMOS transistor, and the description of the constant $g_mR$ biasing tracking circuit may further include descriptions of: a sixth nMOS transistor having a drain electrode connected to a source electrode of the first pMOS transistor; and a seventh nMOS transistor having a drain electrode connected to a source electrode of the second pMOS transistor and having a gate electrode connected to gate electrodes of the fifth nMOS transistor and the sixth nMOS transistor.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1B:
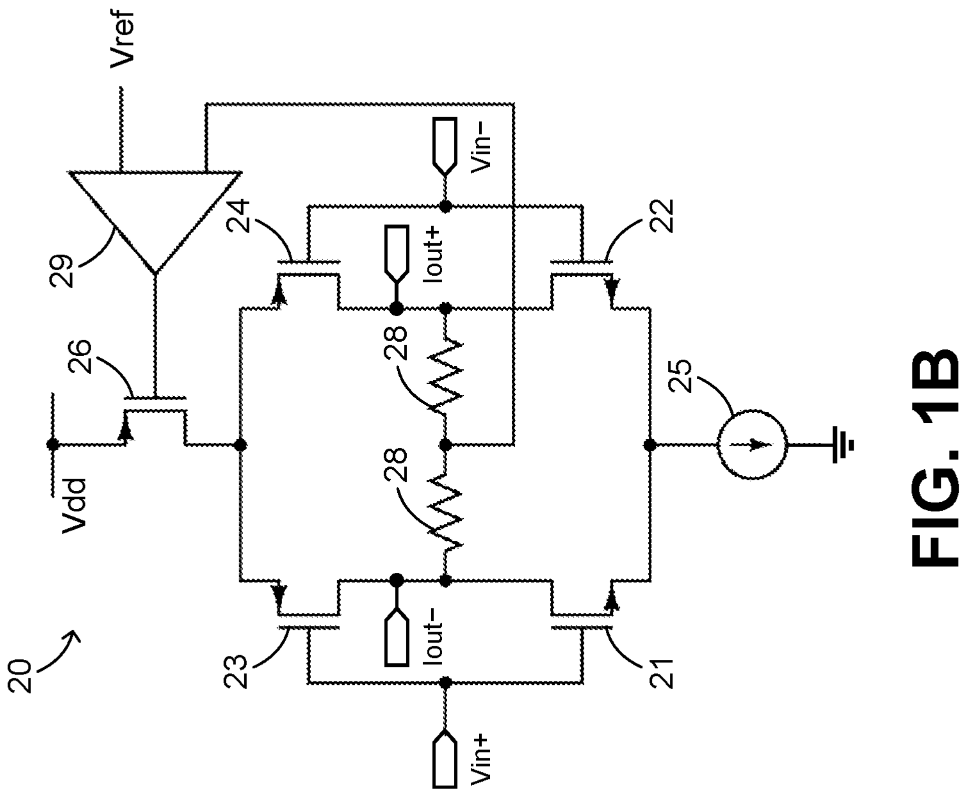
FIG. 1B is a schematic diagram of a differential amplifier that includes n-type metal oxide semiconductor (nMOS) transistors and p-type metal oxide semiconductor (pMOS) transistors and that includes a constant transconductance (gm) tracking biasing circuit that controls a bias current supplied to the differential amplifier.

Aspects of the present disclosure relate to constant transconductance-resistance tracking circuit for complementary metal oxide semiconductor amplifiers.

High-speed analog amplifier circuits need to be power efficient while achieving the required bandwidth. In addition, the performance characteristics of a transistor, such as the transconductance (gm) of a transistor can vary in accordance with process, voltage, and temperature (PVT) variation. For example, differences in semiconductor manufacturing process conditions at different portions of a semiconductor wafer can cause transistors to be formed with slightly different dimensions and consequently different electrical characteristics (e.g., due to optical distortion during lithography steps and different deposition characteristics at central portions versus edge portions of the semiconductor wafer). In addition, during operation, differences in supply voltages and temperature can cause transistors to exhibit different electrical characteristics (e.g., the transconductance of a transistor exhibits temperature dependence).

Various amplifier designs include a compensating circuit to counteract the PVT variation. FIG. 1A is a schematic diagram of a differential amplifier 10 that includes n-type metal oxide semiconductor (nMOS) transistors 11 and 12. The voltage gain Gv provided by the circuit can be computed based on the product of the transconductance ($g_m$) of the nMOS transistors and the drain resistance (R). The transconductance gm of the nMOS transistors 11 and 12 are set by a current source 15 connected between the source electrodes of the nMOS transistors 11 and 12 and ground. As such, a constant transconductance-resistance ($g_m$R) tracking biasing circuit may be used to control a bias current generated by the current source 15 (e.g., by mirroring the currents generated by the circuits described below with respect to FIG. 2 and FIG. 3) such that the gain ($g_m$R) of the differential amplifier is substantially constant.

In the schematic diagram shown in FIG. 1A, the drain electrodes of the nMOS transistors are connected to a supply voltage Vdd through a feedback transistor 16 and load transistors 17. A common-mode feedback circuit of the differential amplifier 10 includes a feedback signal taken from a node between two resistors 18 connected in series between the drain electrodes of the nMOS transistors 11 and 12 is supplied as an input to an op-amp 19, which compares the feedback signal to a reference voltage Vref to control the feedback transistor 16.

As such, by controlling the current source 15, the constant gm tracking biasing circuit controls the overall gain of the differential amplifier 10 to be substantially constant over PVT variation. For example, controlling the bias current generated by the current source 15 controls the transconductance $g_m$ to track as 1/R such that the product ($g_m$R) of the transconductance ($g_m$) and the load resistance (R) is substantially constant across PVT variation.

In some semiconductor process technologies, such as planar semiconductor process technologies, where p-type metal oxide semiconductor (pMOS) and nMOS transistors have very different strengths (different transconductance values $g_m$), an amplifier circuit may primarily make use of nMOS transistors, such as where the inputs (Vin+ and Vin−) to a differential amplifier are supplied to the gate electrodes of a differential pair of nMOS transistors, such as in the example shown in FIG. 1A. In a differential pair, the transistors of the differential pair are formed physically close to one another and with the same dimensions (such as width and length) so that the two transistors have substantially the same electrical characteristics (e.g., the process variations are assumed to be substantially constant in the neighborhood where the two transistors are located). In some semiconductor process technologies, nMOS transistors are typically preferred because pMOS transistors typically exhibit lower $g_m$ values than comparably-sized nMOS transistors. Accordingly, the differential amplifier 10 shown in FIG. 1A includes a differential pair of nMOS transistors, and the constant $g_m$R tracking biasing circuit includes a corresponding nMOS transistor to track the behavior of the nMOS transistors of the differential amplifier 10. As seen in FIG. 1A, the transistor 17 is a pMOS transistor, but it is used (e.g., as a variable resistor) to control the bias current supplied to the amplifier 10.

In some semiconductor process technologies, such as fin field-effect transistor (FinFET) technology, pMOS transistors and nMOS transistors are almost equally strong (e.g., have similar transconductance ($g_m$) values). In such a case, an nMOS transistor and a pMOS transistor can be connected together (e.g., connected in series, with the same input signal applied to the gate electrodes of the nMOS and pMOS transistors) to double the effective $g_m$ of the amplifier circuit while using the same bias current, where this arrangement may be referred to herein as a complementary metal oxide semiconductor (cMOS) arrangement.

Figure 1A:
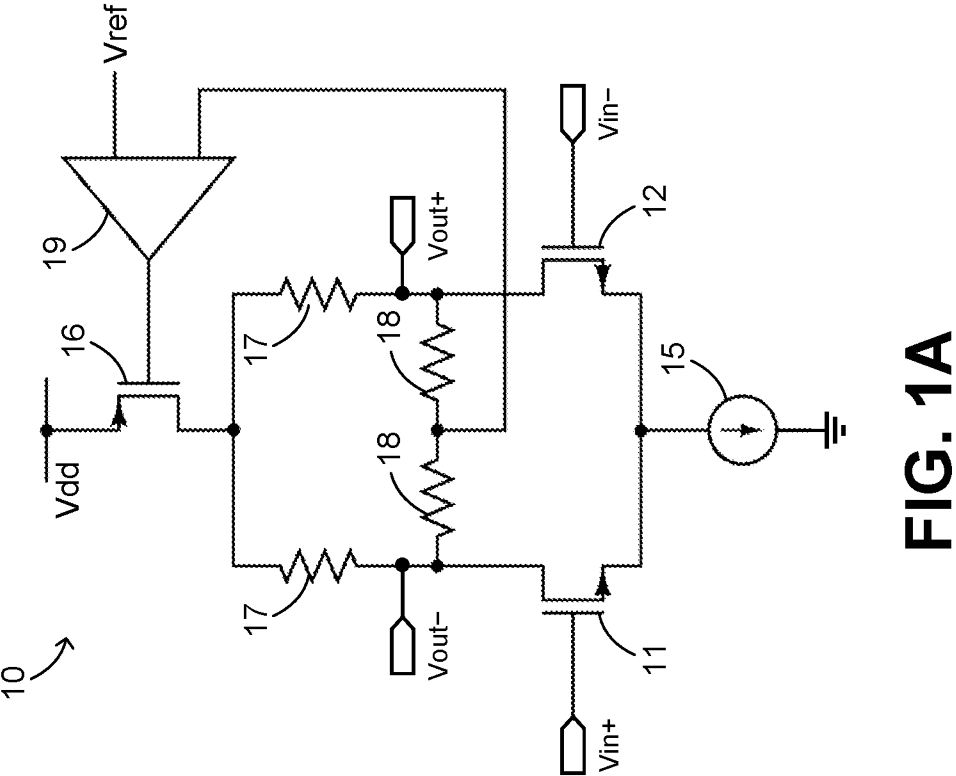
FIG. 1A is a schematic diagram of a differential amplifier that includes n-type metal oxide semiconductor (nMOS) transistors and that includes a constant transconductance (gm) tracking biasing circuit that controls a bias current supplied to the differential amplifier.

FIG. 1B is a schematic diagram of a cMOS differential amplifier 20 that includes n-type metal oxide semiconductor (nMOS) transistors 21 and 22 and p-type metal oxide semiconductor (pMOS) transistors 23 and 24. In particular, a non-inverting input Vin+ is supplied to the gate electrodes of a first nMOS transistor 21 and a first pMOS transistor 23 which are connected in series, and an inverting input Vin− is supplied to the gate electrodes of a second nMOS transistor 22 and a second pMOS transistor 24 connected in series in a cMOS transistor arrangement. As shown in FIG. 1B, the cMOS differential amplifier 20 produces a current output at Iout− and Iout+ and therefore may be referred to as a transadmittance amplifier or transconductance amplifier. In a similar manner to the differential amplifier 10 shown in FIG. 1A, the cMOS differential amplifier 20 includes a current source 25 that controls a bias current flowing through the cMOS differential amplifier 20, where the bias current sets the transconductance (gm) of the nMOS transistors 21 and 22 and the pMOS transistors 23 and 24.

Like the nMOS differential amplifier 10 shown in FIG. 1A, the cMOS differential amplifier 20 includes a feedback transistor 26 and a common-mode feedback circuit that includes a feedback signal taken from a node between two resistors 28 connected in series between a first node at the drain electrodes of the first nMOS transistor 21 and the first pMOS transistor 23 and a second node at the drain electrodes of the second nMOS transistor 22 and the second pMOS transistor 24. The feedback signal is supplied as an input to an op-amp 29, which compares the feedback signal to a reference voltage Vref to control the feedback transistor 26.

As noted in the background, process, voltage, and temperature (PVT) variations can cause variations in the gain of an amplifier. In order to control the gain and the gain variation, a constant gm-R tracking circuit is used to control the bias current that is provided to the amplifier that controls the overall transconductance (Gm) of the amplifier as a whole. In particular, a constant gm-R tracking circuit includes at least one transistor that matches the characteristics of the input transistors of the amplifier circuit, such that process, voltage, and temperature variations affecting the electrical characteristics (e.g., gm) of input transistors of the amplifier circuit also affect the electrical characteristics of the corresponding transistor in the constant gm-R tracking circuit. As such, a constant gm-R tracking circuit generates a signal to control the bias current supplied to the amplifier in order to compensate for the PVT variation exhibited by the amplifier circuit and thereby control the gain (e.g., control the overall transconductance Gm) of the amplifier.

Prior constant $g_m$R tracking biasing circuits provide signals that account for only PVT variation of nMOS transistors or only the PVT variation of pMOS transistors and therefore are unable to fully account for PVT variation that arise in cMOS amplifier circuits that use both nMOS and pMOS transistors as input pairs, such that control over the gain of the cMOS amplifier circuit is compromised.

As such, aspects of the present disclosure relate to constant $g_m$R tracking biasing circuits that account for PVT variation in nMOS transistors and pMOS transistors and that therefore control the overall transconductance-resistance ($g_m$R or effective gain) of a cMOS amplifier (e.g., cMOS differential amplifier) that includes nMOS and pMOS input transistor pairs to be substantially constant over PVT variation. In some examples, a constant $g_m$R tracking biasing circuit according to the present disclosure includes both nMOS and pMOS transistors such that the constant $g_m$R tracking biasing circuit can generate a signal that accounts for process, voltage, and temperature (PVT) variations that affect both types of transistors. This signal may then be used to control the bias current that is provided to a cMOS analog amplifier such that the output of the cMOS analog amplifier is kept substantially constant over the PVT variation.

Technical advantages of the present disclosure include, but are not limited to: controlling the $g_m$ and gain variation of a cMOS amplification stage, in particular across temperature variations, which is an important contributor in overall performance (e.g., predictable and controlled performance of the cMOS amplification stage).

In particular, $g_m$ typically decreases as temperature increases. Some comparative techniques compensate for this decrease in $g_m$ by keeping the bias current elevated, even at typical (e.g., low) operating temperatures. However, the higher bias current results in higher power consumption. In addition, supporting higher bias current may also require wider metal routes and larger devices, which can increase the parasitic capacitance of the circuit, thereby reducing the bandwidth of the analog amplifier. As such, a constant gm-R tracking biasing circuit provides a low-power alternative technique for controlling the gain of the analog amplifier, even as temperature increases and that also reduces the parasitic capacitance of the analog amplifier, thereby increasing the bandwidth of the analog amplifier.

The various examples of the present disclosure can control the effective transconductance-resistance $g_m$R of an amplifier circuit that includes both pMOS and nMOS transistors, which provides a technical advantage in that the amplifier circuit attains high bandwidth for a given level of power consumption, and where the use of pMOS and nMOS transistors together in a cMOS configuration increases the overall gain of the amplifier without an increase in bias current (e.g., without an increase in power consumption). This high bandwidth is important in various applications such as 100G serializer-deserializer (SerDes) designs for network communications, which involve the use of linear amplifiers having high bandwidth such as 40 GHz. In some example implementations of the present disclosure, the variation of the gm is reduced to about 1.1× (or about 10%) as opposed to a more than 2× variation (or about 100%) in gm in some comparative amplifiers.

Figure 2:
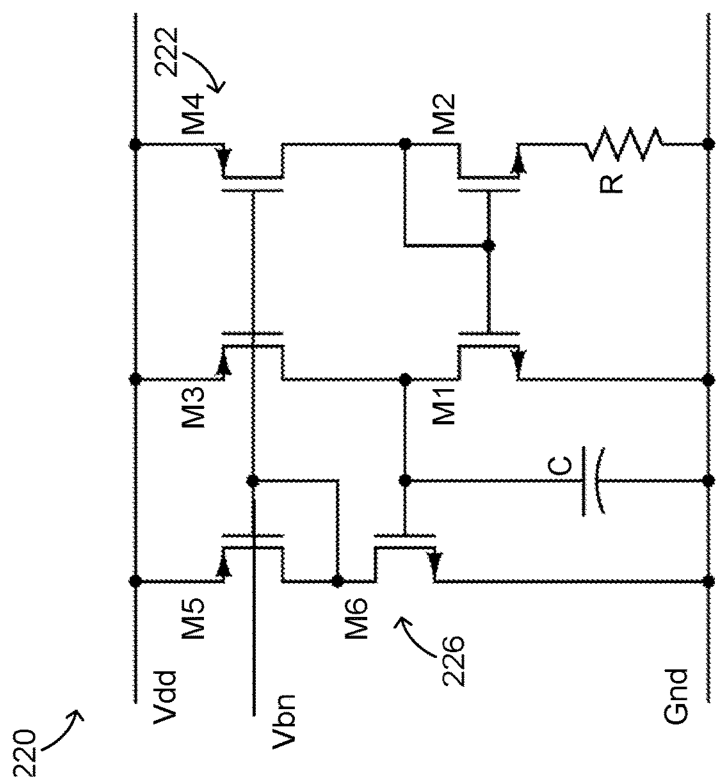
FIG. 2 is a schematic depiction of a constant transconductance-resistance ($g_m$R) tracking biasing circuit according to one example of the present disclosure having separate circuit portions for tracking pMOS and nMOS transistors.
Figure 2:
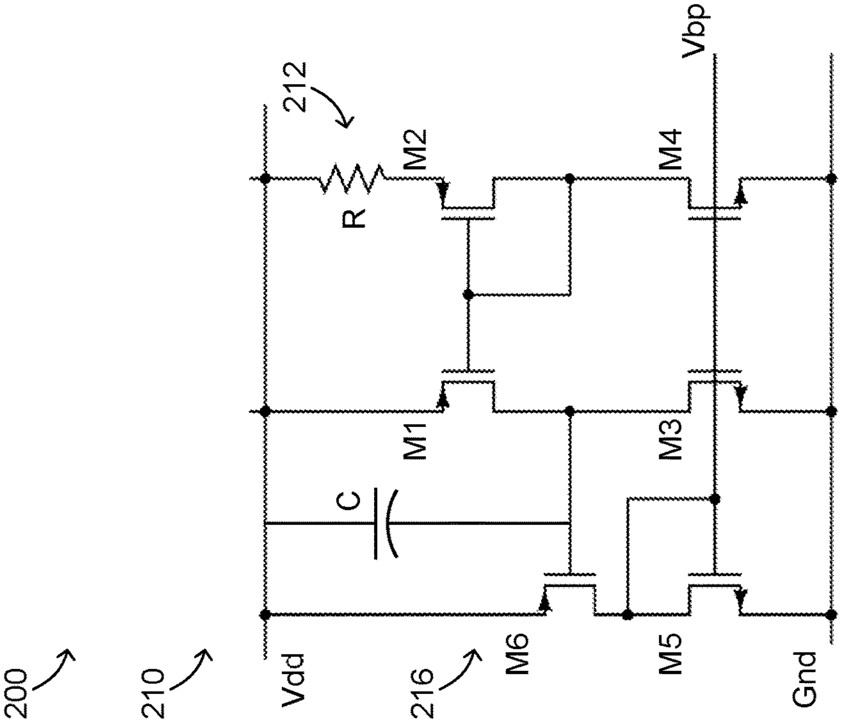

FIG. 2 is a schematic depiction of a constant transconductance-resistance ($g_m$R) tracking biasing circuit 200 according to one example of the present disclosure having separate circuit portions for tracking pMOS and nMOS transistors. As shown in FIG. 2, the constant $g_m$R tracking biasing circuit 200 includes a pMOS tracking circuit portion 210 generating a first bias signal or first bias current tracking pMOS transistors and an nMOS tracking circuit portion 220 generating a second bias signal or second bias current tracking nMOS transistors.

In more detail, a pMOS tracking circuit portion 210 of the constant $g_m$R tracking biasing circuit 200 functions includes a tracking circuit portion 212 that includes pMOS transistors to track the PVT behavior of pMOS transistors on the semiconductor die. In particular, a first pMOS transistor M1 has a width Wp1 and a length Lp1 and a second pMOS transistor M2 has a width Wp2 and a length Lp2. The width Wp2 and length Lp2 of the second pMOS transistor M2 are chosen such that:

$$\frac{Wp2}{Lp2} = m\left(\frac{Wp1}{Lp1}\right)$$

The first pMOS transistor M1 and the second pMOS transistor M2 are arranged as a current mirror, with the second pMOS transistor M2 being diode connected. The source electrode of the first pMOS transistor M1 is connected to a supply voltage Vdd, and the source electrode of the second pMOS transistor M2 is connected to the supply voltage Vdd through a variable resistor R. A third nMOS transistor M3 is connected between the drain electrode of the first pMOS transistor M1 and ground, and a fourth nMOS transistor is connected between the drain electrode of the second pMOS transistor M2 and ground.

An amplifier circuit portion 216 of the pMOS tracking circuit portion 210 controls the current flowing through the two arms of the tracking circuit portion 212 (including first pMOS transistor M1 and second pMOS transistor M2) to be the same, where the amplifier circuit portion 216 includes a fifth nMOS transistor M5 and a sixth pMOS transistor M6. The fifth nMOS transistor M5 has a source electrode connected to ground and a drain electrode connected to the drain electrode of the sixth pMOS transistor M6, and the fifth nMOS transistor M5 is diode connected to form a second current mirror with the third nMOS transistor M3 and the fourth nMOS transistor M4. The source electrode of the sixth pMOS transistor M6 is connected to a supply voltage. A capacitor C (or compensation capacitor) is connected between the gate electrode of the sixth pMOS transistor M6 and the supply voltage to provide compensation due to the feedback loop that controls the drain-source voltage Vds of both arms of the constant $g_m$R tracking biasing circuit in order to ensure stability margins of the feedback loop remain intact. While the compensation capacitor C is illustrated in FIG. 2 as a polarized capacitor, the disclosure is not limited thereto and may be implemented instead with a non-polar or device capacitor. The gate electrodes of the third nMOS transistor M3, the fourth nMOS transistor M4, and the fifth nMOS transistor M5 are connected to generate an output pMOS bias voltage Vbp to set a bias current in accordance with PVT variation of the first and second pMOS transistors M1 and M2. For example, the pMOS bias voltage Vbp may be used to control a current flowing through a current mirror that mirrors the current to a current source such as the current source 25 in the cMOS differential amplifier 20 of FIG. 1B.

Similarly, the nMOS tracking circuit portion 220 includes a tracking circuit portion 222 that includes nMOS transistors to track the PVT behavior of nMOS transistors on the semiconductor die. In particular, a first nMOS transistor M1 has a width Wn1 and a length Ln1 and a second nMOS transistor M2 has a width Wn2 and a length Ln2. The width Wn2 and length Ln2 of the second nMOS transistor M2 are chosen such that:

$$\frac{Wn2}{Ln2} = m\left(\frac{Wn1}{Ln1}\right)$$

The first nMOS transistor M1 and the second nMOS transistor M2 are arranged as a current mirror, with the second nMOS transistor M2 being diode connected. The source electrode of the first nMOS transistor M1 is connected to ground, and the source electrode of the second nMOS transistor M2 is connected to ground through a variable resistor R. A third pMOS transistor M3 is connected between the drain electrode of the first nMOS transistor M1 and a supply voltage Vdd, and a fourth pMOS transistor is connected between the drain electrode of the second nMOS transistor M2 and the supply voltage Vdd.

An amplifier circuit portion 226 of the nMOS tracking circuit portion 220 controls the current flowing through the two arms of the tracking circuit portion 222 (including first nMOS transistor M1 and second nMOS transistor M2) to be the same, where the amplifier circuit portion 226 includes a fifth pMOS transistor M5 and a sixth nMOS transistor M6. The fifth pMOS transistor M5 has a source electrode connected to the supply voltage Vdd and a drain electrode connected to the drain electrode of the sixth nMOS transistor M6, and the fifth pMOS transistor M5 is diode connected to form a second current mirror with the third pMOS transistor M3 and fourth pMOS transistor M4. The source electrode of the sixth nMOS transistor M6 is connected to ground. A capacitor C is connected between the gate electrode of the sixth nMOS transistor M6 and ground to provide compensation due to the feedback loop that controls the drain-source voltage Vds of both arms of the constant gmR tracking biasing circuit in order to ensure stability margins of the feedback loop remain intact. While the compensation capacitor C is illustrated in FIG. 2 as a polarized capacitor, the disclosure is not limited thereto and may be implemented instead with a non-polar or device capacitor. The gate electrodes of the third pMOS transistor M3, the fourth pMOS transistor M4, and the fifth pMOS transistor M5 are connected to generate an output nMOS bias voltage Vbn to set a bias current in accordance with PVT variation of the first and second nMOS transistors M1 and M2.

In more detail, in some examples of the present disclosure, the pMOS bias voltage Vbp output by the pMOS tracking circuit portion 210 is supplied to a current source (e.g., mirrored to the current source) that sets a pMOS bias current Ipmos in accordance with:

$$Ipmos = \frac{2}{R^2 * \mu p * Cox * \left(\frac{Wp1}{Lp1}\right)} * \left[1 - \sqrt{\left\{\frac{1}{m}\right\}}\right]^2$$

where μp is the hole mobility of the pMOS transistor and Cox is the oxide capacitance of the pMOS transistor.

As such, with the pMOS bias current Ipmos, the transconductance $g_{mp}$ of the pMOS transistor (e.g., first pMOS transistor M1) is given by:

$$g_{mp} = \frac{2}{R} * \left[1 - \sqrt{\left\{\frac{1}{m}\right\}}\right]$$

Similarly, the nMOS bias voltage Vbn output by the nMOS tracking circuit portion 220 is supplied to a current source (e.g., mirrored to the current source) that sets an nMOS bias current Inmos in accordance with:

$$Inmos = \frac{2}{R^2 * \mu n * Cox * \left(\frac{Wn1}{Ln1}\right)} * \left[1 - \sqrt{\left\{\frac{1}{m}\right\}}\right]^2$$

where µn is the electron mobility of the pMOS transistor and Cox is the oxide capacitance of the nMOS transistor (assumed to be the same oxide capacitance as the pMOS transistor).

As such, with the nMOS bias current Inmos, the transconductance $g_{mn}$ of the nMOS transistor (e.g., first nMOS transistor M1) is given by:

$$g_{mn} = \frac{2}{R} * \left[1 - \sqrt{\left\{\frac{1}{m}\right\}}\right]$$

In various examples of the present disclosure, the nMOS bias voltage Vbn and the pMOS bias voltage Vbp may be used to set the nMOS bias current Inmos and the pMOS bias current Ipmos, respectively, where the two currents are added together to track the effective transconductance $g_m = g_{mn} + g_{mp}$ of the cMOS differential amplifier based on the sum of the transconductances of the nMOS and pMOS transistors of the cMOS differential amplifier (or other analog cMOS circuit).

Assuming Wp1/Lp1=Wn1/Ln1=W/L, combining both set the nMOS bias current Inmos and the pMOS bias current Ipmos to track the effective for CMOS amplifier results in a combined bias current Ibias:

$$Ibias = Inmos + Ipmos = \frac{2}{R^2 * Cox * \left(\frac{W}{L}\right)} * \left[1 - \sqrt{\left\{\frac{1}{m}\right\}}\right]^2 * \left[\frac{l}{\mu n} + \frac{1}{\mu p}\right]$$

Using the combined bias current Ibias to bias a cMOS amplifier (e.g., the cMOS differential amplifier shown in FIG. 1), and assuming that the geometry of the input pMOS and nMOS transistors of the cMOS differential amplifier match those of the pMOS tracking circuit portion 210 and the nMOS tracking circuit portion 220 of the constant $g_m$R tracking biasing circuit 200, the transconductance $g_{mn}$ of the nMOS transistors and the transconductance $g_{mp}$ of the pMOS transistors are set as follows:

$$g_{mn} = \frac{2}{R} * \left[1 - \sqrt{\left\{\frac{1}{m}\right\}}\right] * \sqrt{1 + \frac{\mu n}{\mu p}}$$

$$g_{mp} = \frac{2}{R} * \left[1 - \sqrt{\left\{\frac{1}{m}\right\}}\right] * \sqrt{1 + \frac{\mu p}{\mu n}}$$

In a particular case where m=4, the above expressions simplify to:

$$g_{mn} = \frac{1}{R} * \sqrt{1 + \frac{\mu n}{\mu p}}$$

$$g_{mp} = \frac{1}{R} * \sqrt{1 + \frac{\mu p}{\mu n}}$$

Furthermore, by choosing the same size resistor R in the pMOS tracking circuit portion 210, the nMOS tracking circuit portion 220, and in load resistor R of amplifier, then the gain $g_{mn}$R provided by the nMOS transistors and the gain $g_{mp}$R provided by the pMOS transistors simplifies to:

$$g_{mn}R = \sqrt{1 + \frac{\mu n}{\mu p}}$$

$$g_{mp}R = \sqrt{1 + \frac{\mu p}{\mu n}}$$

Figure 4:
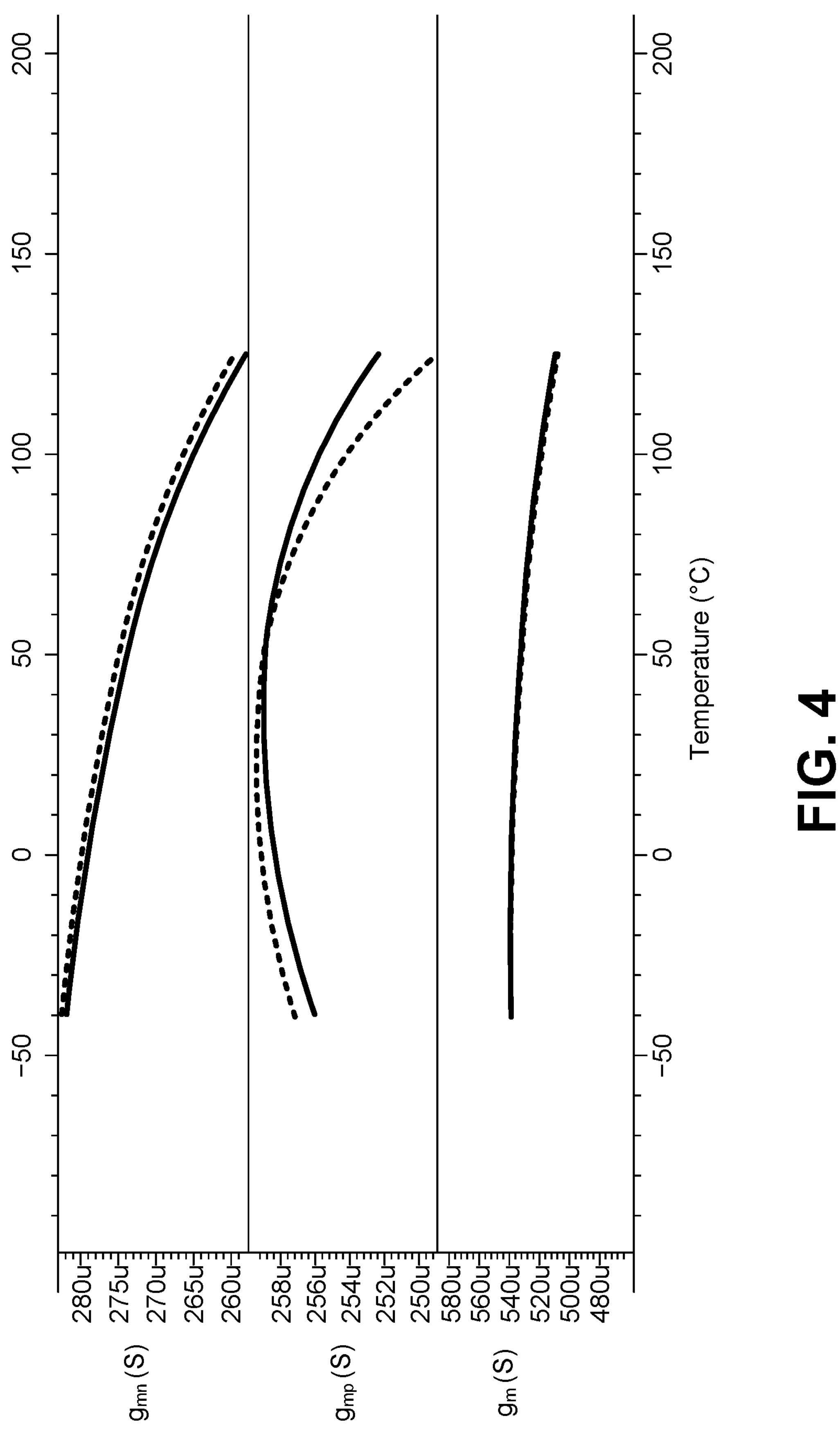
FIG. 4 depicts graphs of the transconductance (gm) of p-type transistors and n-type transistors in different skewed process corners (slow-fast sf and fast-slow fs), and overall transconductance of the compensated circuit according to the present disclosure across a range of temperature values and in different process corners (sf and fs).

Accordingly, by supplying this tracking bias current to bias a cMOS amplifier circuit, the cMOS amplifier circuit is controlled to have substantially constant $g_m$R behavior, because the above expressions depend only on the electron mobility µn and the hole mobility µp and because the reciprocal relationship in this dependency on carrier mobility in the expressions for the transconductances of the pMOS transistors and the nMOS transistors causes the bias current to be set in a manner that cancels out process variation in combined transconductance of the cMOS analog circuit, as discussed in more detail below with respect to Table 1 and FIG. 4.

In some example embodiments, the current source (e.g., current source 25 shown in FIG. 1B) is controlled to generate the bias current based on the pMOS bias voltage Vbp and the nMOS bias voltage Vbn generated by the pMOS tracking circuit portion 210 and the nMOS tracking circuit portion 220 using two voltage-to-current converters connected in parallel such that the currents generated by the two different voltage-to-current converters are added together and supplied to the cMOS amplifier circuit. In some examples of the present disclosure, the current outputs of the separate pMOS tracking circuit portion 210 and nMOS tracking circuit portion 220 are summed using aliases and/or metal resistors, where a first alias has one end connected to the pMOS tracking circuit portion 210 and a second alias has one end connected to the nMOS tracking circuit portion 220, and where the other ends of the first and second alias are shorted such that the resulting current output is the sum of the separate currents set by the pMOS tracking circuit portion 210 and the nMOS tracking circuit portion 220. The voltage-to-current converters may be implemented using, for example, separate voltage-controlled current mirrors to generate Ipmos and Inmos.

The above analysis shows the implementation of a constant transconductance-resistance ($g_m$R) tracking biasing circuit 200 using a pMOS tracking circuit portion 210 and a separate nMOS tracking circuit portion 220. However, the above analysis assumes that the strength of the pMOS transistors and the nMOS transistors is the same. However, this assumption may not hold in skewed process corners where one of the devices is stronger than the other (e.g., where nMOS transistors are stronger than comparable pMOS transistors).

As such, a constant transconductance-resistance ($g_m$R) tracking biasing circuit according to some additional examples of the present disclosure is provided that can set a bias current appropriately to compensate for PVT variation in pMOS and nMOS transistors, even in skewed process corners.

Figure 3:
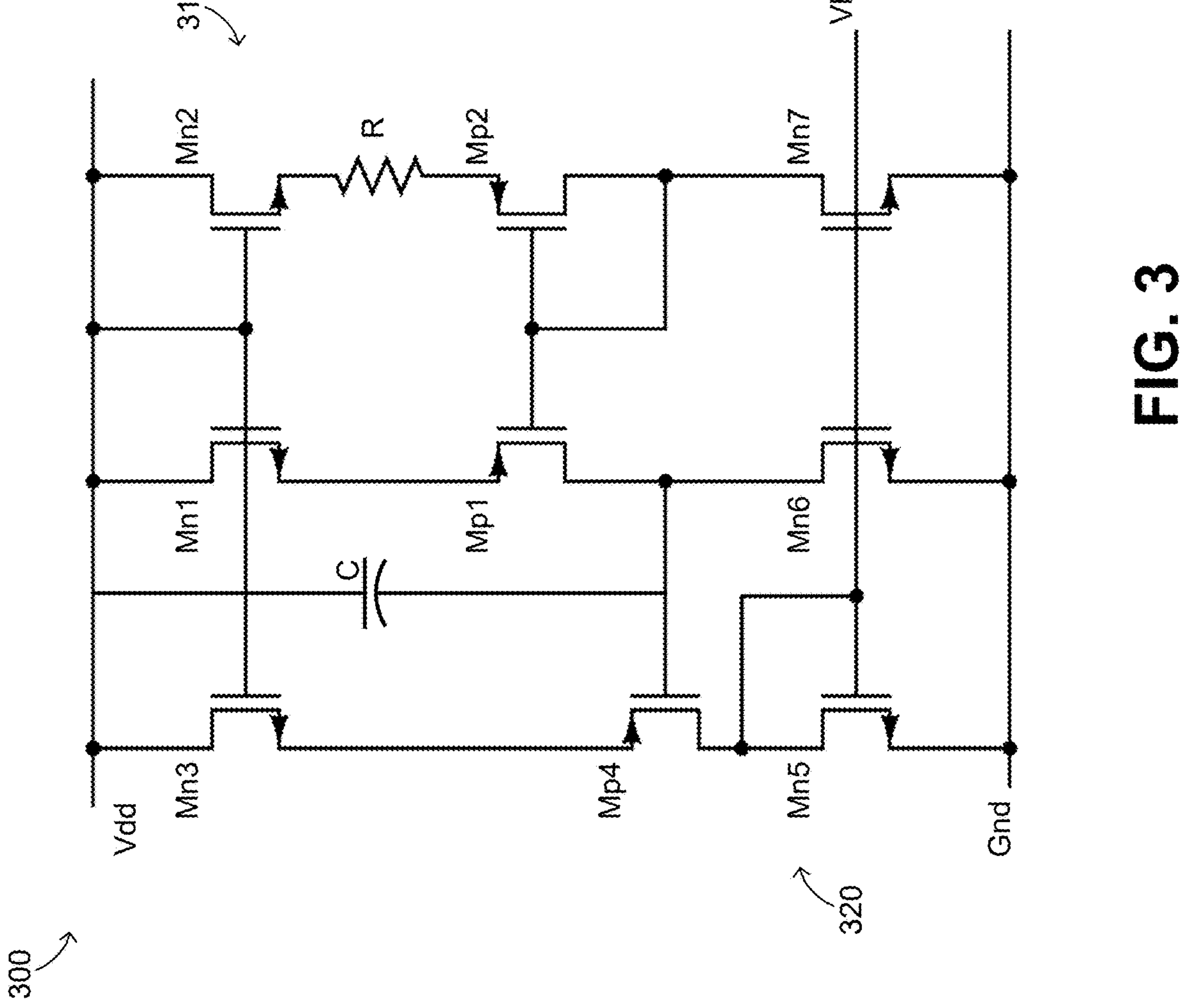
FIG. 3 is a schematic depiction of a constant transconductance-resistance ($g_m$R) tracking biasing circuit according to one example of the present disclosure having a single circuit portion for tracking both pMOS and nMOS transistors.

FIG. 3 is a schematic depiction of a constant transconductance-resistance ($g_m$R) tracking biasing circuit 300 according to one example of the present disclosure having a single circuit portion for tracking both pMOS and nMOS transistors. As shown in FIG. 3, the constant $g_m$R tracking biasing circuit 300 includes a tracking circuit portion 310 and an amplifier circuit portion 320. The tracking circuit portion 310 includes a first nMOS transistor Mn1 and a second nMOS transistor forming a first current mirror, where the second nMOS transistor Mn2 is diode connected.

The tracking circuit portion 310 also includes a first pMOS transistor Mp1 and a second pMOS transistor forming a second current mirror, where the second pMOS transistor is diode connected.

The first nMOS transistor Mn1 has a width Wn1 and a length Ln1 and the second nMOS transistor Mn2 has a width Wn2 and a length Ln2. The width Wn2 and length Ln2 of the second nMOS transistor Mn2 are chosen such that:

$$\frac{Wn2}{Ln2} = m\left(\frac{Wn1}{Ln1}\right)$$

Similarly, the first pMOS transistor Mp1 has a width Wp1 and a length Lp1 and a second pMOS transistor Mp2 has a width Wp2 and a length Lp2. The width Wp2 and length Lp2 of the second pMOS transistor Mp2 are chosen such that:

$$\frac{Wp2}{Lp2} = m\left(\frac{Wp1}{Lp1}\right)$$

The source electrode of the first nMOS transistor Mn1 is connected to the source electrode of the first pMOS transistor Mp1, and the source electrode of the second nMOS transistor Mn2 is connected to the source electrode of the second pMOS transistor Mp2 through a variable resistor R. The drain electrodes of the first nMOS transistor Mn1 and the second nMOS transistor Mn2 are connected to a supply voltage Vdd. A third nMOS transistor Mn3 has a drain electrode connected to the supply voltage Vdd, and the gate electrodes of the first nMOS transistor Mn1, the second nMOS transistor Mn2, and the third nMOS transistor Mn3 are connected together.

The amplifier circuit portion 320 of the constant $g_m$R tracking biasing circuit 300 includes a fourth pMOS transistor Mp4 and a fifth nMOS transistor Mn5. The source electrode of the fourth pMOS transistor Mp4 is connected to the source electrode of the third nMOS transistor Mn3 and the drain electrode of the fourth pMOS transistor Mp4 is connected to the drain electrode of the fifth nMOS transistor Mn5. A gate electrode of the fourth pMOS transistor Mp4 is connected to the drain electrode of the first pMOS transistor Mp1. A capacitor C is connected between the gate electrode of the fourth pMOS transistor Mp4 and the supply voltage Vdd to provide compensation due to the feedback loop that controls the drain-source voltage Vds of both arms of the constant $g_m$R tracking biasing circuit in order to ensure stability margins of the feedback loop remain intact. While the compensation capacitor C is illustrated in FIG. 2 as a polarized capacitor, the disclosure is not limited thereto and may be implemented instead with a non-polar or device capacitor. The fifth nMOS transistor Mn5 is diode connected and forms a current mirror with a sixth nMOS transistor Mn6. The sixth nMOS transistor Mn6 has a drain electrode connected to the drain electrode of the first pMOS transistor Mp1 (and also to the gate electrode of the fourth pMOS transistor Mp4) and a source electrode connected to ground. A seventh nMOS transistor Mn7 has a drain electrode connected to the drain electrode of the second pMOS transistor Mp2 and a source electrode connected to ground. The gate electrodes of the fifth nMOS transistor Mn5, the sixth nMOS transistor Mn6, and the seventh nMOS transistor Mn7 are connected together.

The amplifier circuit portion 320 controls the currents through the two arms of the tracking circuit portion 310 of the constant $g_m$R tracking biasing circuit 300 (e.g., a first arm through the first nMOS transistor Mn1, the first pMOS transistor Mp1, and the sixth nMOS transistor Mn6 and a second arm through the second nMOS transistor Mn2, the second pMOS transistor Mp2, and the seventh nMOS transistor Mn7) to be equal. This equal current represents the tracked bias current Ib to be supplied to the tracked amplifier circuit:

$$Ib = \frac{2}{R^2 * Cox} * \left[1 - \left(\frac{1}{\sqrt{m}}\right)\right]^2 * \left[\frac{1}{\sqrt{\left\{\mu n * \left(\frac{Wn1}{Ln1}\right)\right\}}} + \frac{1}{\sqrt{\left\{\mu p * \left(\frac{Wp1}{Lp1}\right)\right\}}}\right]^2$$

where, as above, µn is the electron mobility, µp is the hole mobility, and Cox is the oxide capacitance of the transistors. By setting the bias current to Ib as above, the transconductance gmn1 of the first nMOS transistor Mn1 is set as follows:

$$g_{mn1} = \frac{2}{R} * \left[1 - \left(\frac{1}{\sqrt{m}}\right)\right] * \left[1 + \frac{\sqrt{\left\{\mu n * Cox * \left(\frac{Wn1}{Ln1}\right)\right\}}}{\sqrt{\left\{\mu p * Cox * \left(\frac{Wp1}{Lp1}\right)\right\}}}\right]$$

Similarly, the transconductance gmp1 of the first pMOS transistor Mp1 is set as follows:

$$g_{mp1} = \frac{2}{R} * \left[1 - \left(\frac{1}{\sqrt{m}}\right)\right] * \left[1 + \frac{\sqrt{\left\{\mu p * Cox * \left(\frac{Wp1}{Lp1}\right)\right\}}}{\sqrt{\left\{\mu n * Cox * \left(\frac{Wn1}{Ln1}\right)\right\}}}\right]$$

Assuming that Wn1/Ln1=Wp1/Lp1=W/L and setting m=4, the above expression for the bias current Ib can be simplified to:

$$Ib = \frac{1}{2 * R^2 * Cox * W/L} * \left[\frac{1}{\sqrt{\{\mu n\}}} + \frac{1}{\sqrt{\{\mu p\}}}\right]^2$$

Accordingly, the expression for the transconductance gmn1 of the first nMOS transistor Mn1 simplifies to:

$$gmn1 = \frac{1}{R} * \left[1 + \frac{\sqrt{\{\mu n\}}}{\sqrt{\{\mu p\}}}\right]$$

Similarly, the transconductance gmp1 of the first pMOS transistor Mp1 simplifies to:

$$gmp1 = \frac{1}{R} * \left[1 + \frac{\sqrt{\{\mu p\}}}{\sqrt{\{\mu n\}}}\right]$$

Furthermore, by choosing the same size resistor R in the constant $g_m$R tracking biasing circuit 300 and in load resistor R of amplifier and assuming that the geometry of the input pMOS and nMOS transistors of the cMOS differential amplifier match those of the pMOS and nMOS tracking transistors (e.g., first pMOS transistor Mp1 and first nMOS transistor Mn1), then the gain $g_{mn}R$ provided by the nMOS transistors and the gain $g_{mp}R$ provided by the pMOS transistors simplifies to:

$$g_{mn}R = 1 + \frac{\sqrt{\{\mu n\}}}{\sqrt{\{\mu p\}}}$$

$$g_{mp}R = 1 + \frac{\sqrt{\{\mu p\}}}{\sqrt{\{\mu n\}}}$$

Accordingly, by supplying this tracking bias current to bias a cMOS amplifier circuit, the cMOS amplifier circuit is controlled to have substantially constant $g_mR$ behavior, because the above expressions depend only on the electron mobility μn and the hole mobility μp.

In more detail, the voltage Vb at the line connecting the gate electrodes of the fifth nMOS transistor Mn5, the sixth nMOS transistor Mn6, and the seventh nMOS transistor Mn7 corresponds to the current flowing through the arms of the current mirrors of the tracking circuit portion 310 of the constant $g_mR$ tracking biasing circuit 300 and therefore this bias voltage Vb may be supplied to control a current source to supply a bias current to an amplifier circuit (e.g., current source 25 shown in FIG. 1).

While the example shown in FIG. 3 shows that the bias voltage Vb corresponding to the bias current is read from the line connecting the gate electrodes of the fifth nMOS transistor Mn5, the sixth nMOS transistor Mn6, and the seventh nMOS transistor Mn7, the present disclosure is not limited thereto. For example, a bias voltage Vb may equivalently be read, instead, from the line connecting the gate electrodes of the first nMOS transistor Mn1, the second nMOS transistor Mn2, and the third nMOS transistor Mn3.

As such, the bias voltage Vb output by the constant $g_mR$ tracking biasing circuit 300 of FIG. 3, whether taken from the gate electrodes of the first, second and third nMOS transistors Mn1, Mn2, and Mn3 or as taken from the gate electrodes of the fifth, sixth, and seventh nMOS transistors Mn5, Mn6, and Mn7, reflects or tracks process, voltage, and temperature variations as affecting the nMOS transistors Mn1 and Mn2 and the pMOS transistors Mp1 and Mp2 and therefore may be used to set a bias current to control the transconductances of nMOS and pMOS transistors in a cMOS analog circuit to be substantially constant or to have substantially constant gain (transconductance-resistance or $g_mR$).

Table 1 below summarizes the expected transconductance (gm) variation in a circuit using pMOS and nMOS transistors across five different process corners, where the bias currents are set, in Case 1, by two separate circuits that generates bias currents accounting for PVT variation for the nMOS transistors (Inmos) and for the pMOS transistors (Ipmos) (e.g., the constant $g_mR$ tracking biasing circuit 200 of FIG. 2) and, in Case 2, by a single circuit that generates a single bias current accounting for PVT variation for the nMOS transistors and the pMOS transistors (e.g., the constant $g_mR$ tracking biasing circuit 300 of FIG. 3).

The process corners relate to different circumstances in which carrier mobilities (hole mobility μp and electron mobility μn) are higher or lower than typical. The five conditions shown in Table 1 include typical-typical (tt), slow-slow (ss), fast-fast (ff), slow-fast (sf), and fast-slow (fs). In the example of Table 1, it is assumed that higher mobility (fast) relates to a carrier mobility that is 20% higher than typical and lower mobility (slow) relates to a carrier mobility that is 20% lower than typical. It is also assumed that resistance remains substantially the same across the different process corners. The 20% difference in carrier mobility between typical and fast or typical and slow cases are provided merely as an example and the present disclosure is not limited thereto.

TABLE 1

| | Process corner | | | | |
|---|---|---|---|---|---|
| Parameter | tt | ss | ff | sf | fs |
| μp | 1 | 0.8 | 1.2 | 1.2 | 0.8 |
| μn | 1 | 0.8 | 1.2 | 0.8 | 1.2 |
| R | 1 | 1 | 1 | 1 | 1 |
| Case 1: separate nMOS and pMOS currents are added to generate total bias current for amplifier | | | | | |
| $g_{mn}$ = 1/R*sqrt(1 + (μn/μp)) | 1.414 | 1.414 | 1.414 | 1.581 | 1.291 |
| $g_{mp}$ = 1/R*sqrt(1 + (μp/μn)) | 1.414 | 1.414 | 1.414 | 1.291 | 1.581 |
| $g_{meff} = g_{mn} + g_{mp}$ | 2.828 | 2.828 | 2.828 | 2.872 | 2.872 |
| $g_m$-variation(%) | | 0.000 | 0.000 | 1.545 | 1.545 |
| Case 2: using single circuit with pMOS and nMOS to generate a single bias current for the amplifier | | | | | |
| $g_{mn}$ = 1/R*(1 + sqrt(μn/μp)) | 2.000 | 2.000 | 2.000 | 2.225 | 1.816 |
| $g_{mp}$ = 1/R*(1 + sqrt(μp/μn)) | 2.000 | 2.000 | 2.000 | 1.816 | 2.225 |
| $g_{meff} = g_{mn} + g_{mp}$ | 4.000 | 4.000 | 4.000 | 4.041 | 4.041 |
| $g_m$-variation(%) | | 0.000 | 0.000 | 1.031 | 1.031 |

As seen in Table 1, above, in Case 1, a constant $g_mR$ tracking biasing circuit with separate circuits for generating separate bias currents for tracking PVT variation in nMOS and pMOS transistors (e.g., a constant $g_mR$ tracking biasing circuit 200 of FIG. 2) controls the effective transconductance of a cMOS amplifier circuit. In the ss and ff process corners, the constant $g_mR$ tracking biasing circuit controls the transconductances of the nMOS and pMOS transistors to match the typical-typical values (e.g., with 0% variation). This constant $g_mR$ tracking biasing circuit controls the bias current such that, in the sf process corner, the transconductance $g_{mn}$ of the nMOS transistor increases and the transconductance $g_{mp}$ of the pMOS transistor decreases, such that the effective transconductance $g_{meff}$ in the cMOS amplifier $g_{meff}=g_{mn}+g_{mp}$ is within 1.545% of the effective transconductance $g_{meff}$ in the typical-typical process corner. Likewise, in the fs process corner, the transconductance $g_{mn}$ of the nMOS transistor decreases and the transconductance $g_{mp}$ of the pMOS transistor increases, such that the effective transconductance $g_{meff}$ in the cMOS amplifier $g_{meff}=g_{mn}+g_{mp}$ is within 1.545% of the effective transconductance $g_{meff}$ in the typical-typical process corner.

As seen in Table 1, above, Case 2 relates to a constant $g_mR$ tracking biasing circuit with a single circuit that generates a bias current for tracking PVT variation in both nMOS and pMOS transistors (e.g., a constant $g_mR$ tracking biasing circuit 300 of FIG. 3) that controls the effective transconductance $g_{meff}$ of a cMOS amplifier circuit. In a manner similar to that of Case 1, in the ss and ff process corners, the constant $g_mR$ tracking biasing circuit of Case 2 controls the transconductances of the nMOS and pMOS transistors to match the typical-typical values (e.g., with 0% variation). In the sf process corner, the transconductance $g_{mn}$ of the nMOS transistor increases and the transconductance $g_{mp}$ of the pMOS transistor decreases, such that the effective transconductance $g_{meff}$ in the cMOS amplifier $g_{meff}=g_{mn}+g_{mp}$ is within 1.031% of the effective transconductance $g_{meff}$ in the typical-typical process corner. Likewise, in the fs process corner, the transconductance $g_{mn}$ of the nMOS transistor decreases and the transconductance $g_{mp}$ of the pMOS transistor increases, such that the effective transconductance $g_{meff}$ in the cMOS amplifier $g_{meff}=g_{mn}+g_{mp}$ is within 1.031% of the effective transconductance $g_{meff}$ in the typical-typical process corner.

As such, a constant $g_mR$ tracking biasing circuit according to Case 2 (with a single circuit generating a single current that tracks both nMOS and pMOS transistors) further improves the tracking of the control of the transconductance of the amplifier circuit in comparison to a constant $g_mR$ tracking biasing circuit according to Case 1 (with separate circuits generating two different currents for tracking nMOS and pMOS transistors).

FIG. 4 depicts graphs of the transconductance (gm) of p-type transistors and n-type transistors in different skewed process corners (slow-fast sf and fast-slow fs), and overall transconductance of the compensated circuit according to the present disclosure across a range of temperature values and in different process corners (sf and fs). In particular, the transconductance are shown in units of siemens (S), and data is shown over a temperature range of about −40 degrees Celsius to about 130 degrees Celsius. As shown in FIG. 4, the transconductance $g_{mn}$ of an nMOS transistor decreases with increasing temperature, and where the change in transconductance $g_{mn}$ differs slightly between the different skewed process corners sf and fs, as shown by the dashed line versus the dotted line. In addition, the transconductance $g_{mp}$ of a pMOS transistor rises from about −40° C. to about 30° C. or 40° C., after which the transconductance $g_{mp}$ of a pMOS transistor falls with increasing temperature. Here, FIG. 4 shows, based on the solid line and the dashed line, that the temperature dependence of the transconductance $g_{mp}$ of a pMOS transistor differs between different skewed process corners. A combined transconductance $g_m$ of a cMOS amplifier circuit with a bias current set by a constant $g_mR$ tracking biasing circuit with a single circuit that tracks both pMOS and nMOS transistors (e.g., Case 2 above and/or the examples of FIG. 3) is substantially stable across the shown temperature range of about −40 degrees Celsius to about 130 degrees Celsius.

Accordingly, Table 1 and FIG. 4 illustrate how examples of the present disclosure control the $g_mR$ of a cMOS amplifier by setting a bias current to provide substantially constant $g_mR$ across different process variations (e.g., across ss, ff, sf, and fs process corners) (e.g., within ±2% of nominal).

Figure 5:
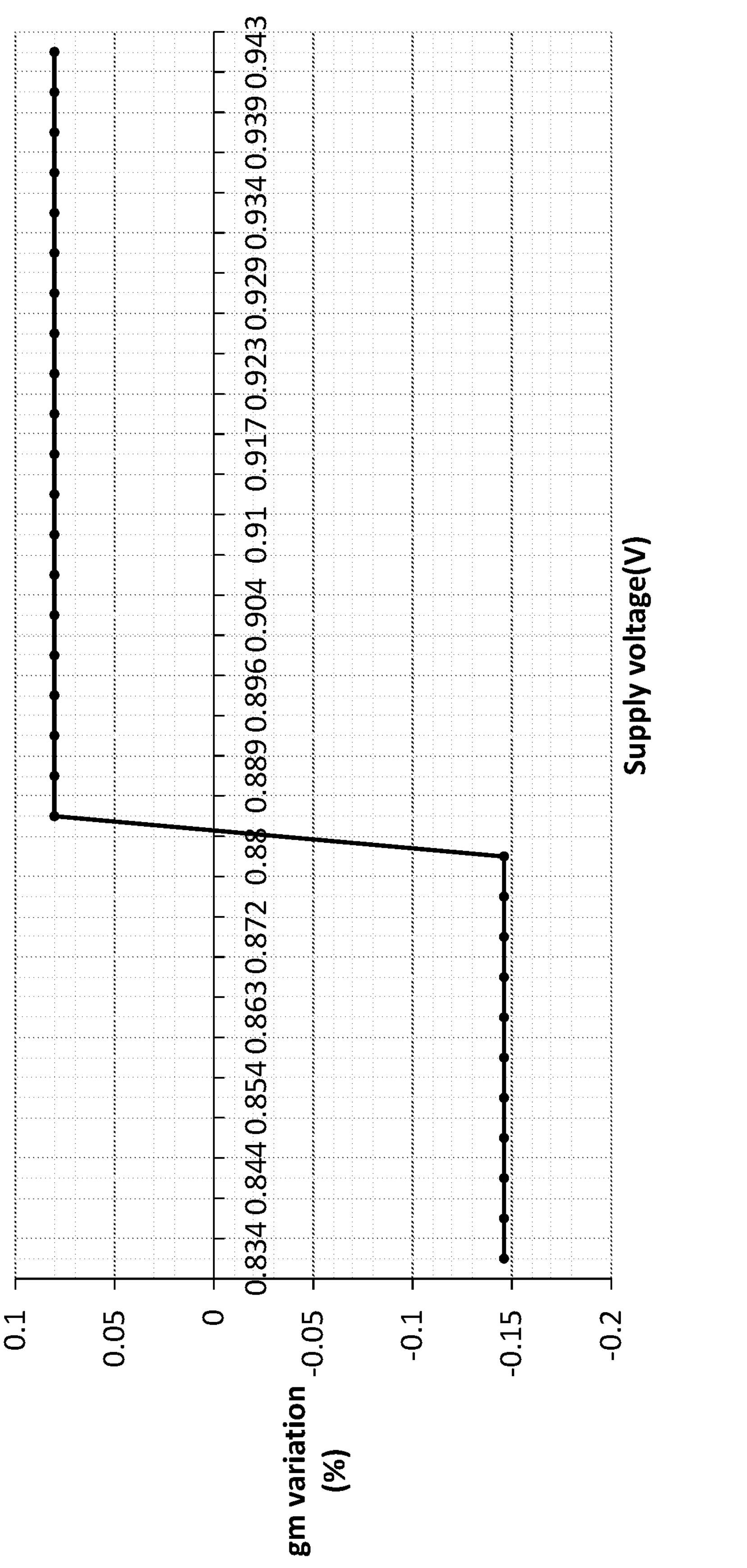
FIG. 5 depicts graphs of the percentage variation of transconductance (gm) of the compensated circuit according to the present disclosure across a range of supply voltage values.

FIG. 5 depicts graphs of the percentage variation of transconductance (gm) of the compensated circuit according to the present disclosure across a range of supply voltage values. In particular, assuming nominal process and temperature conditions, varying the supply voltage from about 0.834V to about 0.943V (e.g., more than a 10% change in supply voltage) results in a change in transconductance ranging from −0.15% to about +0.08% (e.g., within ±0.15% of nominal across a supply voltage variation of ±10%). Accordingly, a constant $g_mR$ tracking biasing circuit according to the present disclosure controls a cMOS amplifier to provide substantially constant $g_mR$ across a range of supply voltages.

Figure 6:
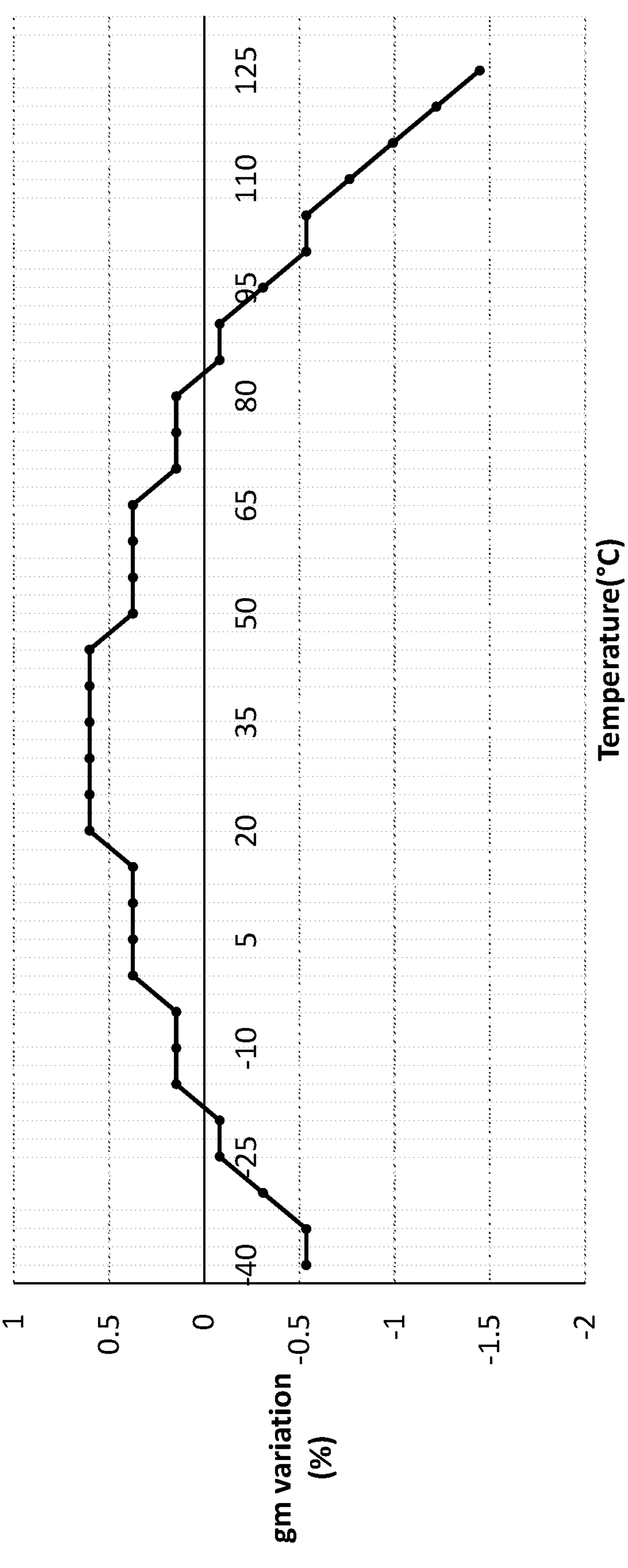
FIG. 6 depicts a graph of the percentage variation of transconductance (gm) of a compensated circuit according to the present disclosure across a range of temperature values.

FIG. 6 depicts a graph of the percentage variation of transconductance (gm) of a compensated circuit according to the present disclosure across a range of temperature values. As shown in FIG. 6, over a temperature range of about −40 degrees Celsius to about 125 degrees Celsius, the gm variation is controlled to be between −1.5% and +0.6% (e.g., within ±1.5% of nominal over a range of −40° C. to 125° C.).

Figure 7:
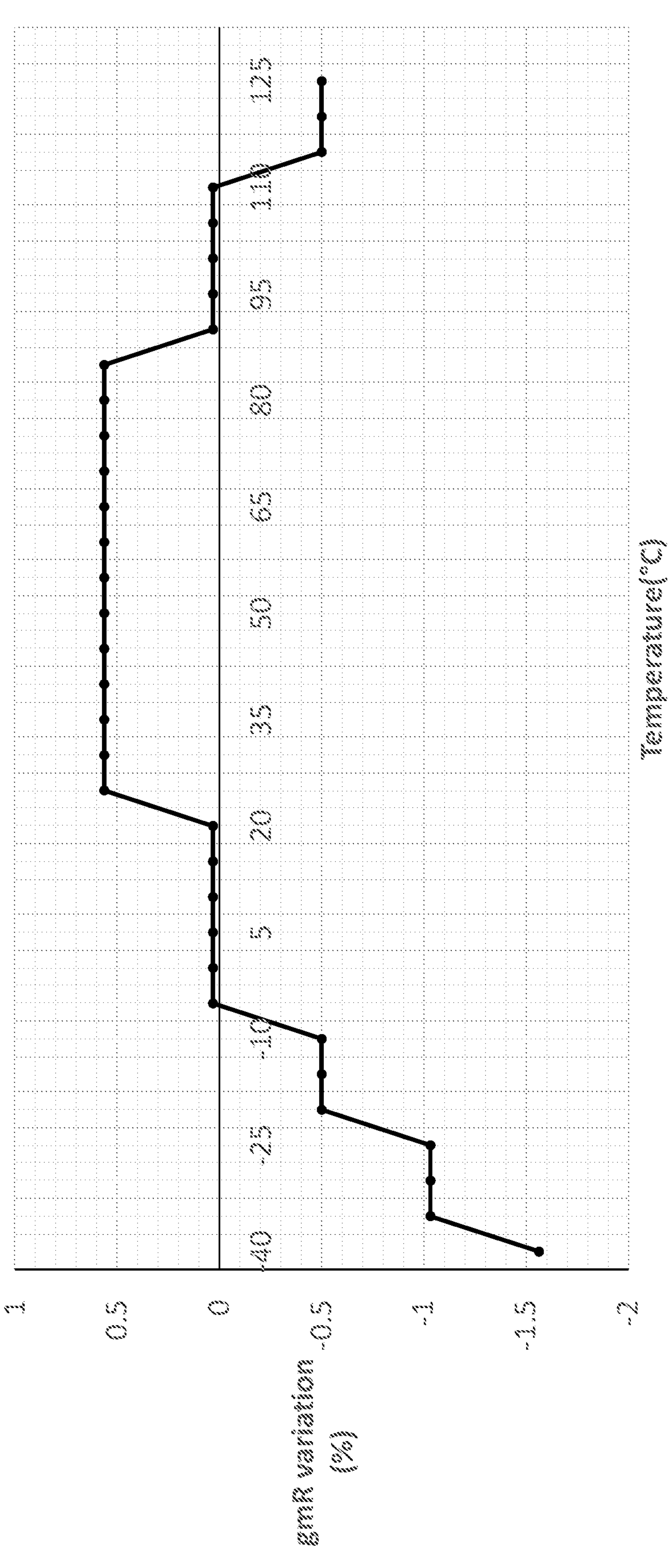
FIG. 7 depicts a graph of the percentage variation of transconductance-resistance (gmR) of a compensated circuit according to the present disclosure across a range of temperature values.

FIG. 7 depicts a graph of the percentage variation of transconductance-resistance (gmR) of a compensated circuit according to the present disclosure across a range of temperature values. As shown in FIG. 7, over a temperature range of about −40 degrees Celsius to about 130 degrees Celsius, the $g_mR$ variation is controlled to be between −1.5% and +0.6% (e.g., within ±1.5% of nominal over a range of −40° C. to 125° C.).

As such, various examples of the present disclosure provide a constant $g_mR$ tracking biasing circuit that generates or sets a bias current that tracks the PVT variation of both pMOS and nMOS transistors, such that changes in transconductance arising from PVT variation are reduced or canceled out, such that the $g_mR$ of a circuit (e.g., an analog amplifier) is kept constant over the PVT variation. In some implementations, the constant $g_mR$ tracking biasing circuit draws 183 μA from a 0.9V supply and therefore consumes very little additional power.

Some examples of the present disclosure relate to a constant $g_mR$ tracking biasing circuit that includes two separate tracking circuit portions: a pMOS tracking circuit portion that generates a first current tracking a pMOS transistor and an nMOS tracking circuit portion that generates a second current tracking an nMOS transistor.

Some additional examples of the present disclosure relate to a constant $g_mR$ tracking biasing circuit that includes a single tracking circuit that generates a single current that tracks both pMOS and nMOS transistors. This may provide some additional advantages over examples of the present disclosure that use separate tracking circuit portions for pMOS and nMOS transistors, such as reduced area, reduced power consumption, and tighter control over the transconductance due to the sharing of circuit components.

Figure 8:
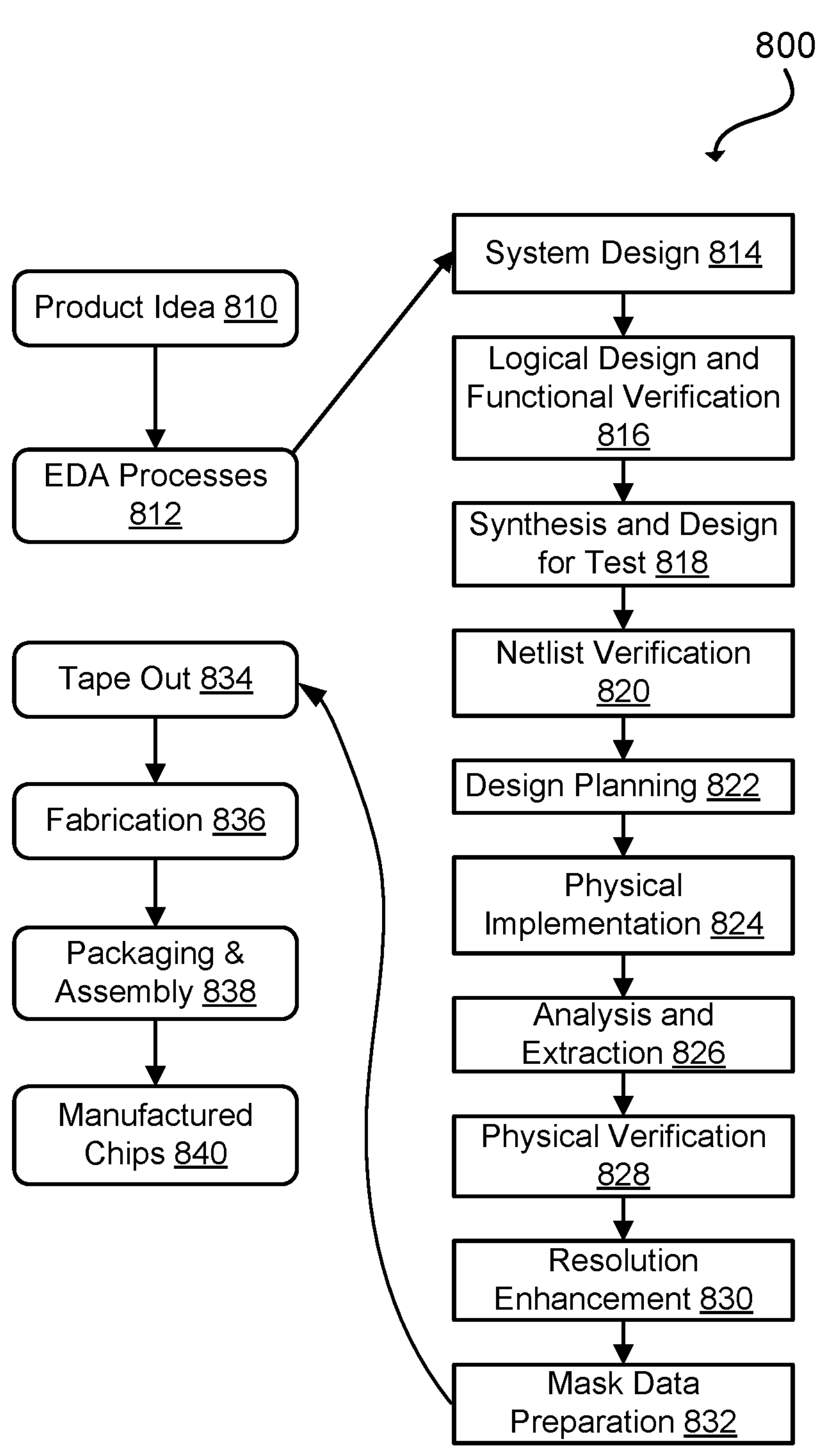
FIG. 8 depicts a flowchart of various processes used during the design and manufacture of an integrated circuit in accordance with some embodiments of the present disclosure.

FIG. 8 illustrates an example set of processes 800 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 810 with information supplied by a designer, information which is transformed to create an article of manufacture that uses a set of EDA processes 812. When the design is finalized, the design is taped-out 834, which is when artwork (e.g., geometric patterns) for the integrated circuit is sent to a fabrication facility to manufacture the mask set, which is then used to manufacture the integrated circuit. After tape-out, a semiconductor die is fabricated 836 and packaging and assembly processes 838 are performed to produce the finished integrated circuit 840.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 8. The processes described by be enabled by EDA products (or EDA systems).

During system design 814, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 816, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 818, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 820, the netlist is checked for compliance with timing constraints and for correspondence with the HDL code. During design planning 822, an overall floor plan for the integrated circuit is constructed and analyzed for timing and top-level routing.

During layout or physical implementation 824, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

A computer-readable design of a constant $g_mR$ tracking biasing circuit according to the present disclosure may be included within a library of available pre-designed cells or circuit blocks or circuit portions stored on a computer-readable medium. This allows the design of a constant $g_mR$ tracking biasing circuit according to the present disclosure to be placed as a circuit block within a design of an integrated circuit. For example, a constant $g_mR$ tracking biasing circuit specified by the computer-readable design may be incorporated into the design of an analog or mixed-signal integrated circuit for communications (e.g., integrated circuits including a differential amplifier or equalizer for a serializer or deserializer for network communications such as Ethernet, having a plurality of ports corresponding to differential pairs, such as an input or receive differential pair and an output or transmit differential pair).

During analysis and extraction 826, the circuit function is verified at the layout level, which permits refinement of the layout design. During physical verification 828, the layout design is checked to ensure that manufacturing constraints are correct, such as DRC constraints, electrical constraints, lithographic constraints, and that circuitry function matches the HDL design specification. During resolution enhancement 830, the geometry of the layout is transformed to improve how the circuit design is manufactured.

During tape-out, data is created to be used (after lithographic enhancements are applied if appropriate) for production of lithography masks. During mask data preparation 832, the 'tape-out' data is used to produce lithography masks that are used to produce finished integrated circuits.

A storage subsystem of a computer system (such as computer system 900 of FIG. 9) may be used to store the programs and data structures that are used by some or all of the EDA products described herein, and products used for development of cells for the library and for physical and logical design that use the library.

Figure 9:
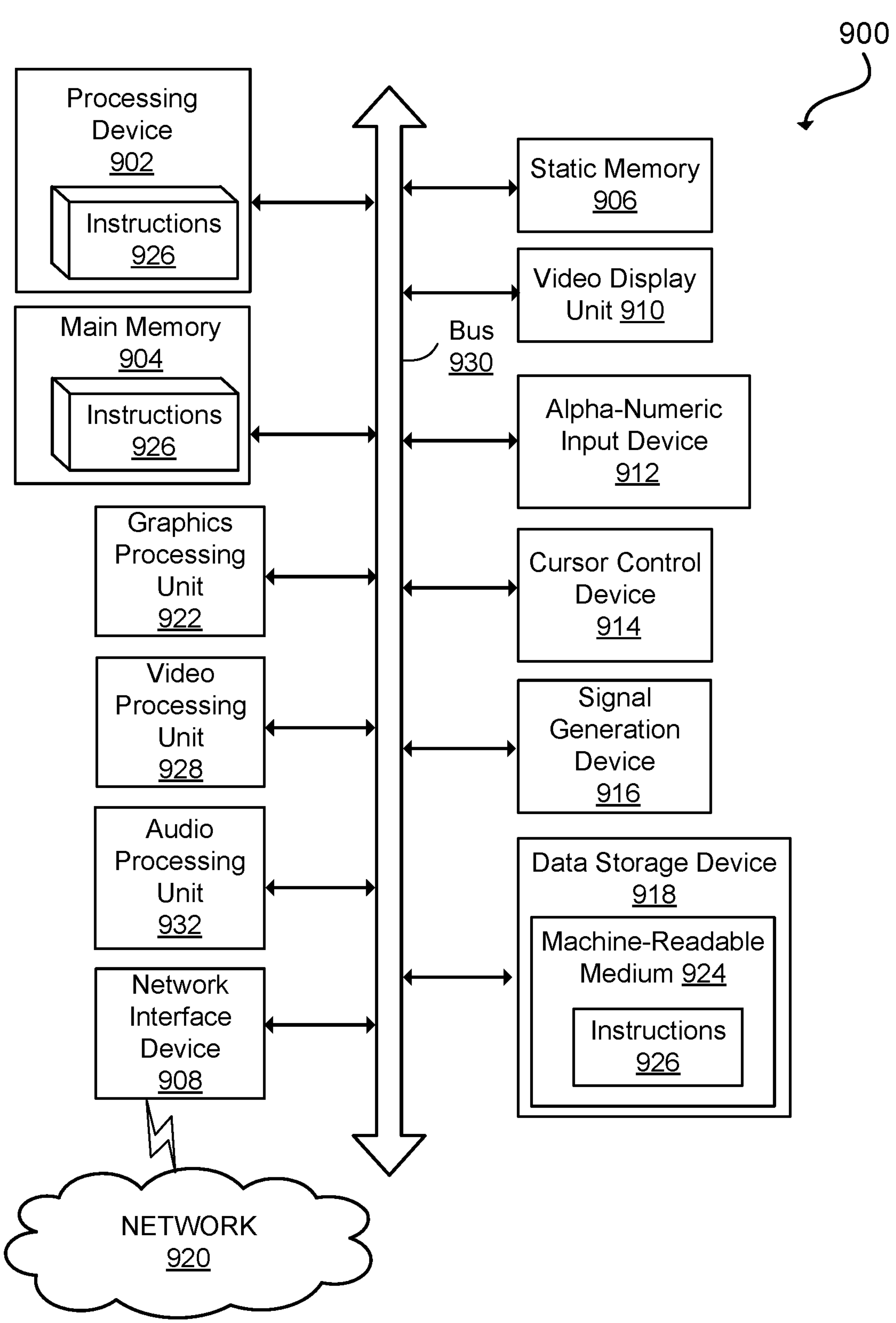
FIG. 9 depicts a diagram of an example computer system in which embodiments of the present disclosure may operate.

FIG. 9 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A constant transconductance-resistance ($g_m R$) tracking biasing circuit comprising:

a first p-type metal oxide semiconductor (pMOS) transistor and a second pMOS transistor connected to form a first current mirror; and a first n-type metal oxide semiconductor (nMOS) transistor and a second nMOS transistor connected to form a second current mirror, wherein gate electrodes of the first nMOS transistor and the second nMOS transistor are electrically connected together and wherein a drain electrode of the second nMOS transistor is directly connected to the gate electrode of the second nMOS transistor such that the second nMOS transistor is diode-connected, the constant $g_m$R tracking biasing circuit being configured to generate a bias output signal in accordance with currents flowing through the first pMOS transistor, the second pMOS transistor, the first nMOS transistor, and the second nMOS transistor, and the bias output signal being configured to control a pMOS transconductance of an input pMOS transistor and an nMOS transconductance of an input nMOS transistor of an analog circuit, the input pMOS transistor and the input nMOS transistor being connected in series.

2. The constant $g_m$R tracking biasing circuit of claim 1, comprising:

a pMOS tracking circuit portion comprising the first pMOS transistor and the second pMOS transistor; and an nMOS tracking circuit portion comprising the first nMOS transistor and the second nMOS transistor, wherein the bias output signal comprises:

an output pMOS bias voltage set by the pMOS tracking circuit portion based on a first current flowing through the first pMOS transistor and a second current flowing through the second pMOS transistor; and an output nMOS bias voltage set by the nMOS tracking circuit portion based on a third current flowing through the first nMOS transistor and a fourth current flowing through the second nMOS transistor, wherein the output pMOS bias voltage is configured to set a pMOS bias current and the output nMOS bias voltage is configured to set an nMOS bias current, and wherein the pMOS transconductance of the input pMOS transistor and the nMOS transconductance of the nMOS input transistor are set based on a sum of the pMOS bias current and the nMOS bias current.

3. The constant $g_m$R tracking biasing circuit of claim 2, wherein the pMOS tracking circuit portion further comprises:

a first amplifier circuit portion configured to control the first current flowing through the first pMOS transistor to be equal to the second current flowing through the second pMOS transistor, and wherein the nMOS tracking circuit portion further comprises:

a second amplifier circuit portion configured to control the third current flowing through the first nMOS transistor to be equal to the fourth current flowing through the second nMOS transistor.

4. The constant $g_m$R tracking biasing circuit of claim 3, wherein the pMOS tracking circuit portion further comprises:

a third nMOS transistor connected to a drain electrode of the first pMOS transistor; and a fourth nMOS transistor connected to a drain electrode of the second pMOS transistor, wherein the first amplifier circuit portion comprises a fifth nMOS transistor, the fifth nMOS transistor being diode-connected, wherein the third nMOS transistor, the fourth nMOS transistor, and the fifth nMOS transistor have gate electrodes that are electrically connected together, wherein the output pMOS bias voltage is set based on a voltage at the gate electrodes of the third nMOS transistor, the fourth nMOS transistor, and the fifth nMOS transistor, wherein the nMOS tracking circuit portion further comprises:

a third pMOS transistor connected to a drain electrode of the first nMOS transistor; and a fourth pMOS transistor connected to a drain electrode of the second nMOS transistor, wherein the second amplifier circuit portion comprises a fifth pMOS transistor, the fifth pMOS transistor being diode-connected, wherein the third pMOS transistor, the fourth pMOS transistor, and the fifth pMOS transistor have gate electrodes that are electrically connected together, and wherein the output pMOS bias voltage is set based on a voltage at the gate electrodes of the third pMOS transistor, the fourth pMOS transistor, and the fifth pMOS transistor.

5. The constant $g_m$R tracking biasing circuit of claim 1, wherein the bias output signal comprises an output bias voltage set based on:

a first current flowing through the first pMOS transistor and the first nMOS transistor; and a second current flowing through the second pMOS transistor and the second nMOS transistor.

6. The constant $g_m$R tracking biasing circuit of claim 5, further comprising an amplifier portion configured to control the first current flowing through the first pMOS transistor and the first nMOS transistor to be equal to the second current flowing through the second pMOS transistor and the second nMOS transistor.

7. The constant $g_m$R tracking biasing circuit of claim 6, wherein the amplifier portion comprises:

a third nMOS transistor having a gate electrode connected to gate electrodes of the first nMOS transistor and the second nMOS transistor;

a fourth pMOS transistor having a source electrode connected to a source electrode of the third nMOS transistor and a gate electrode connected to a source electrode of the first pMOS transistor; and a fifth nMOS transistor having a drain electrode connected to a source electrode of the fourth pMOS transistor, and wherein the constant $g_m$R tracking biasing circuit further comprises:

a sixth nMOS transistor having a drain electrode connected to a source electrode of the first pMOS transistor; and a seventh nMOS transistor having a drain electrode connected to a source electrode of the second pMOS transistor and having a gate electrode connected to gate electrodes of the fifth nMOS transistor and the sixth nMOS transistor.

8. The constant $g_m$R tracking biasing circuit of claim 7, wherein the output bias voltage is measured from:

the gate electrodes of the first nMOS transistor, the second nMOS transistor, and the third nMOS transistor, or the gate electrodes of the fifth nMOS transistor, the sixth nMOS transistor, and the seventh nMOS transistor.

9. The constant $g_m$R tracking biasing circuit of claim 1, wherein the bias output signal is configured to control an effective transconductance based on a sum of the pMOS transconductance of the input pMOS transistor and the nMOS transconductance of the nMOS input transistor to within ±1.5% of a nominal effective transconductance value over a temperature range of −40° C. to 125° C.

10. An electrical circuit comprising:

a complementary metal oxide semiconductor (cMOS) analog amplifier comprising:

an input p-type metal oxide semiconductor (pMOS) transistor; and an input n-type metal oxide semiconductor (nMOS) transistor; and a constant transconductance-resistance ($g_mR$) tracking biasing circuit comprising:

a first p-type metal oxide semiconductor (pMOS) transistor and a second pMOS transistor connected to form a first current mirror; and a first n-type metal oxide semiconductor (nMOS) transistor and a second nMOS transistor connected to form a second current mirror, wherein gate electrodes of the first nMOS transistor and the second nMOS transistor are electrically connected together and wherein a drain electrode of the second nMOS transistor is directly connected to the gate electrode of the second nMOS transistor such that the second nMOS transistor is diode-connected, the constant $g_mR$ tracking biasing circuit being configured to generate a bias output signal in accordance with currents flowing through the first pMOS transistor, the second pMOS transistor, the first nMOS transistor, and the second nMOS transistor, and the bias output signal being configured to control a pMOS transconductance of the input pMOS transistor and an nMOS transconductance of the input nMOS transistor such that a gain of the analog amplifier, having an effective transconductance based on a sum of the pMOS transconductance and the nMOS transconductance, is substantially constant.

11. The electrical circuit of claim 10, further comprising:

a differential pair of pMOS transistors comprising the input pMOS transistor and a second input pMOS transistor; and a differential pair of nMOS transistors comprising the input nMOS transistor and a second input nMOS transistor.

12. The electrical circuit of claim 10, wherein the constant $g_mR$ tracking biasing circuit comprises:

a pMOS tracking circuit portion comprising the first pMOS transistor and the second pMOS transistor configured to generate an output pMOS bias voltage; and an nMOS tracking circuit portion comprising the first nMOS transistor and the second nMOS transistor configured to generate an output nMOS bias voltage, wherein the output pMOS bias voltage is configured to set a pMOS bias current and the output nMOS bias voltage is configured to set an nMOS bias current, and wherein the bias output signal is set based on a sum of the pMOS bias current and the nMOS bias current.

13. The electrical circuit of claim 10, wherein the bias output signal comprises an output bias voltage set based on:

a first current flowing through the first pMOS transistor and the first nMOS transistor; and a second current flowing through the second pMOS transistor and the second nMOS transistor.

14. The electrical circuit of claim 13, wherein the constant $g_mR$ tracking biasing circuit comprises an amplifier portion configured to control the first current flowing through the first pMOS transistor and the first nMOS transistor to be equal to the second current flowing through the second pMOS transistor and the second nMOS transistor.

15. A non-transitory computer-readable medium comprising a stored description of a constant transconductance-resistance ($g_mR$) tracking biasing circuit, the constant $g_mR$ tracking biasing circuit comprising:

a first p-type metal oxide semiconductor (pMOS) transistor and a second pMOS transistor connected to form a first current mirror; and a first n-type metal oxide semiconductor (nMOS) transistor and a second nMOS transistor connected to form a second current mirror, wherein gate electrodes of the first nMOS transistor and the second nMOS transistor are electrically connected together and wherein a drain electrode of the second nMOS transistor is directly connected to the gate electrode of the second nMOS transistor such that the second nMOS transistor is diode-connected, the constant $g_mR$ tracking biasing circuit being configured to generate a bias output signal in accordance with currents flowing through the first pMOS transistor, the second pMOS transistor, the first nMOS transistor, and the second nMOS transistor, and the bias output signal being configured to control a pMOS transconductance of an input pMOS transistor and an nMOS transconductance of an input nMOS transistor of an analog circuit, the input pMOS transistor and the input nMOS transistor being connected in series.

16. The non-transitory computer-readable medium of claim 15, wherein the stored description of the constant $g_mR$ tracking biasing circuit comprises descriptions of:

a pMOS tracking circuit portion comprising the first pMOS transistor and the second pMOS transistor; and an nMOS tracking circuit portion comprising the first nMOS transistor and the second nMOS transistor, wherein the bias output signal comprises:

an output pMOS bias voltage set by the pMOS tracking circuit portion based on a first current flowing through the first pMOS transistor and a second current flowing through the second pMOS transistor; and an output nMOS bias voltage set by the nMOS tracking circuit portion based on on a third current flowing through the first nMOS transistor and a fourth current flowing through the second nMOS transistor, wherein the output pMOS bias voltage is configured to set a pMOS bias current and the output nMOS bias voltage is configured to set an nMOS bias current, and wherein the pMOS transconductance of the input pMOS transistor and the nMOS transconductance of the nMOS input transistor are set based on a sum of the pMOS bias current and the nMOS bias current.

17. The non-transitory computer-readable medium of claim 16 wherein the description of the pMOS tracking circuit portion further comprises a description of:

a first amplifier circuit portion configured to control the first current flowing through the first pMOS transistor to be equal to the second current flowing through the second pMOS transistor, and wherein the description of the nMOS tracking circuit portion further comprises a description of:

a second amplifier circuit portion configured to control the third current flowing through the first nMOS transistor to be equal to the fourth current flowing through the second nMOS transistor.

18. The non-transitory computer-readable medium of claim 15, wherein the bias output signal comprises an output bias voltage set based on:

a first current flowing through the first pMOS transistor and the first nMOS transistor; and a second current flowing through the second pMOS transistor and the second nMOS transistor.

19. The non-transitory computer-readable medium of claim 18, wherein the description of the constant $g_m R$ biasing tracking circuit further comprises a description of an amplifier portion configured to control the first current flowing through the first pMOS transistor and the first nMOS transistor to be equal to the second current flowing through the second pMOS transistor and the second nMOS transistor.

20. The non-transitory computer-readable medium of claim 19, wherein the description of the amplifier portion further comprises descriptions of:

a third nMOS transistor having a gate electrode connected to gate electrodes of the first nMOS transistor and the second nMOS transistor;

a fourth pMOS transistor having a source electrode connected to a source electrode of the third nMOS transistor and a gate electrode connected to a source electrode of the first pMOS transistor; and a fifth nMOS transistor having a drain electrode connected to a source electrode of the fourth pMOS transistor, and wherein the description of the constant $g_m R$ biasing tracking circuit further comprises descriptions of:

a sixth nMOS transistor having a drain electrode connected to a source electrode of the first pMOS transistor; and a seventh nMOS transistor having a drain electrode connected to a source electrode of the second pMOS transistor and having a gate electrode connected to gate electrodes of the fifth nMOS transistor and the sixth nMOS transistor.

* * * * *